United States Patent
Geng et al.

(10) Patent No.: US 9,831,879 B2
(45) Date of Patent: Nov. 28, 2017

(54) LOW CORE POWER LEAKAGE STRUCTURE IN IO RECEIVER DURING IO POWER DOWN

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Yan Geng, Shanghai (CN); Kai Zhu, Shanghai (CN); Jie Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/399,462

(22) Filed: Jan. 5, 2017

(65) Prior Publication Data
US 2017/0302278 A1   Oct. 19, 2017

(30) Foreign Application Priority Data
Apr. 18, 2016 (CN) .......................... 2016 1 0239195

(51) Int. Cl.
*H03K 3/3562* (2006.01)
*H03K 19/0185* (2006.01)
(Continued)

(52) U.S. Cl.
CPC ..... *H03K 19/018521* (2013.01); *H03K 3/012* (2013.01); *H03K 3/0372* (2013.01); *H03K 3/35625* (2013.01)

(58) Field of Classification Search
CPC .... H03K 3/012; H03K 3/0372; H03K 3/0375; H03K 3/356156; H03K 3/35625;
(Continued)

(56) References Cited

U.S. PATENT DOCUMENTS 7,941,716 B2 * 5/2011 Priel .............. G01R 31/318536
714/726
9,473,024 B2 * 10/2016 Yamashita .......... H01L 27/0207
(Continued)

FOREIGN PATENT DOCUMENTS

JP      04329024       11/1992
JP      07066710       3/1995

OTHER PUBLICATIONS

European Application No. 17166521.9, Extended European Search Report dated Sep. 28, 2017, 4 pages.

*Primary Examiner* — Vibol Tan
(74) *Attorney, Agent, or Firm* — Kilpatrick Townsend & Stockton LLP (57) ABSTRACT

A receiver includes a first transfer gate, a first inverter, a second inverter, a second transfer gate, a third inverter, and a fourth inverter connected in series, a first power supply supplying power to the first and second inverters, a second power supply supplying power to the third and fourth inverters, a third power supply supplying power to the second transfer gate, first and second signals having opposite logic levels for controlling the first transfer gate. The third power supply is significantly lower than the first or second power supply. The leakage current of the receiver is significantly reduced in the core when the second power
(Continued)

supply remains on but the first power supply is turned off while the performance of the receiver remains the same.

11 Claims, 5 Drawing Sheets

(51) Int. Cl.
    *H03K 3/012*     (2006.01)
    *H03K 3/037*     (2006.01)

(58) Field of Classification Search
    CPC ............. H03K 17/223; H03K 19/0016; H03K 3/35606; H03K 3/356173; H01L 21/8238
    See application file for complete search history.

(56) References Cited

U.S. PATENT DOCUMENTS

| | | | |
|---|---|---|---|
| 2005/0189963 A1 | 9/2005 | Uno | |
| 2009/0058486 A1* | 3/2009 | Ozawa | H03K 3/35625 327/203 |
| 2014/0239936 A1* | 8/2014 | Paglino | G05F 3/26 323/313 |

* cited by examiner

LOW CORE POWER LEAKAGE STRUCTURE IN IO RECEIVER DURING IO POWER DOWN

CROSS-REFERENCES TO RELATED APPLICATIONS

This application claims priority to Chinese patent application No. 201610239195.4, filed on Apr. 18, 2016, the content of which is incorporated herein by reference in its entirety.

FIELD OF THE INVENTION

The present invention generally relates to semiconductor circuits. More particularly, embodiments of the present invention relate to input/output (IO) receivers.

BACKGROUND OF THE INVENTION

An IO receiver is an interface device between the internal core circuit and external IO circuit and is configured to transmit or receive digital and/or analog signals. Because an IO receiver converts IO signals to core signals, the power-down sequence is generally to power down the core circuit first, then the IO interface circuit. However, in the case that the IO power supply is suddenly turned off and for applications where the power down sequence is reversed, there will be current leakage while the core power supply remains on, but the IO power supply is turned off.

BRIEF SUMMARY OF THE INVENTION

Embodiments of the present invention provide a novel input/output (IO) receiver that can significantly reduce leakage current in the core when the core power supply remains on but the IO power supply is turned off while the performance of the IO receiver remains the same.

In an embodiment, an input/output (IO) receiver includes a first transfer gate having a PMOS transistor and an NMOS transistor electrically connected in parallel, a first inverter, a second inverter, a second transfer gate having a PMOS transistor and an NMOS transistor electrically connected in parallel, a third inverter, a fourth inverter, a first power supply configured to supply power to the first inverter and the second inverter, a second power supply configured to supply power to the third inverter and the fourth inverter, a third power supply connected to a gate of the PMOS transistor of the second transfer gate, and a level shifter configured to receive a core signal and generate a first signal having a first logic level and a second signal having a second logic level opposite the first logic level. The first transfer gate, the first inverter, the second inverter, the second transfer gate, the third inverter, and the fourth inverter are connected in series. A gate of the PMOS transistor of the first transfer gate is connected to the first signal, a gate of the NMOS transistor of the first transfer gate is connected to the second signal, and a gate of the NMOS transistor of the second transfer gate is connected to the first power supply.

In an embodiment, the IO receiver further includes a first transistor connected to an output of the first transfer gate, and a second transistor connected to an output of the second transfer gate. The first transistor is configured to pull the output of the first transfer gate to a logic low level when the IO receiver is disabled, and the second transistor is configured to pull the output of the second transfer gate to a logic low level when the IO receiver is disabled.

In an embodiment, the first transistor and the second transistor are NMOS transistors. The first transistor includes a gate connected to the first signal, a drain connected to the output of the first transfer gate, and a source connected to ground. The second transistor includes a drain connected to the output of the second transfer gate and a source connected to ground.

In an embodiment, a gate of the second transistor is connected to a third signal having a third logic level the same as the first logic level of the first signal.

In an embodiment, the IO receiver also includes a fifth inverter powered by the second power supply and having an input connected to the second signal and an output connected to the gate of the second transistor.

In an embodiment, the third signal is generated through an odd number of series-connected inverters in a core portion of the IO receiver.

In an embodiment, a substrate of the PMOS transistor of the second transfer gate is connected to the first power supply, and the substrate of the NMOS transistor of the second transfer gate is connected to ground. A substrate of the first transistor and a substrate of the second transistor are connected to ground.

In an embodiment, the first power supply is an IO power supply, and the second power supply is a core power supply. The third power supply has a voltage level lower than a voltage level of the first power supply.

The following description, together with the accompanying drawings, will provide a better understanding of the nature and advantages of the claimed invention.

BRIEF DESCRIPTION OF THE DRAWINGS

FIG. 2 is a simplified schematic circuit diagram of an IO receiver according to an embodiment of the present invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including", having", "containing" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It will be understood that, when an element is referred to as "adjacent to," "connected to," or "coupled to" another element, it can be disposed adjacent to, connected or coupled to the other element, or intervening elements may also be present. In contrast, when an element is referred to as being "directly connected to," or "directly coupled to" another element, there are no intervening elements present between them. It will be understood that, although the terms "first," "second," "third," etc. may be used herein to describe various elements, components, regions, and/or sections, these elements, components, regions, and/or sections should not be limited by these terms. These terms are only used to distinguish one element, component, region, or section from another region, or section. Thus, a first element, component, region, or section discussed below could be termed a second element, component, region, or section without departing from the teachings of the present invention.

As used herein, the terms "logic low" and "low logic level" may be used interchangeably. The terms "logic high" and "high logic level" may be used interchangeably. The terms "signal" and "signal pin" may be used interchangeably.

Figure 1:
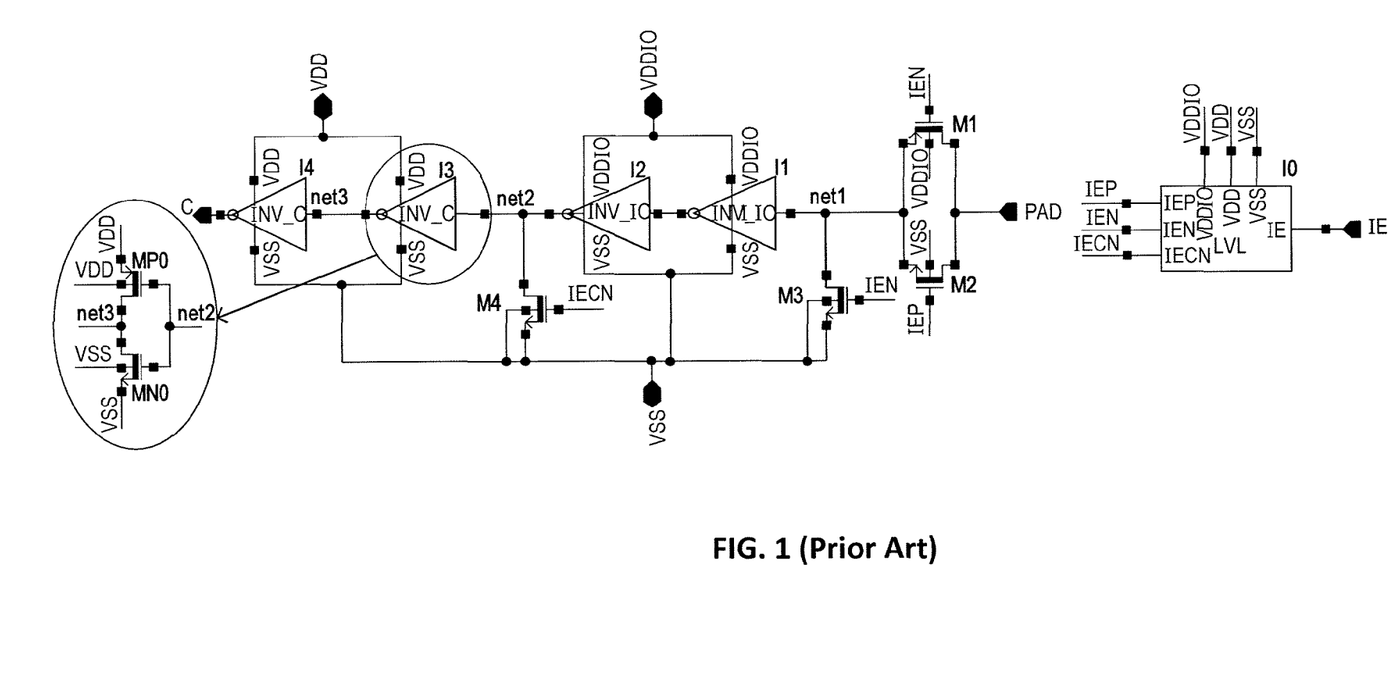
FIG. 1 is a simplified schematic diagram of a circuit configuration of a conventional IO receiver.

Conventional IO receivers are enabled and disabled by core control signal pins. Two cascaded IO inverters and two series-connected core inverters are used after a transfer gate as a basic structure of an IO receiver. FIG. 1 is a simplified schematic diagram of a circuit configuration of a conventional IO receiver 100. IO receiver 100 includes a transfer gate formed of an IO PMOS transistor M1 and an IO NMOS transistor M2, two series-connected IO inverters I1 and I2, and two series-connected core inverters I3 and I4.

Core signal pin IE is used to control whether the IO receiver is enabled or disabled. IECN is an internal core signal and has an opposite logic level to an input signal IE; IEP is an internal IO signal and has the same logic level as the signal IE; IEN is an internal IO signal and has an opposite logic level to the signal IE. IECN is typically generated from the input signal IE through an odd number of core inverters. IEN and IEP are typically generated from the input signal IE through a level shifter and/or an IO buffer. Herein, the circuit is simplified as LVL IO, as shown in FIG. 1.

When the IO power supply VDDIO and core power supply VDD are on, and when IE is logic high, IEP is logic high, IECN and IEN are logic low, the transfer gate is enabled, M3 (IO NMOS) and M4 (IO NMOS) are turned off, the voltage v(C) at a node C follows the logic level of v(PAD) of the node PAD, and the IO receiver is enabled. When IE is logic low, IEP is logic low, IECN and IEN are logic high, the transfer gate is disabled, M3 and M4 are turned on, v(net1) and v(net2) are pulled to logic low; regardless of the voltage level of v(PAD), v(c) remains logic low, and the IO receiver is disabled.

However, when the core power supply remains on and the IO power supply is shut off when the IO receiver is enabled, if the IE pin is not able to detect that the IO power supply is powered down and remains logic high, then when the IO power supply voltage falls from Vth(MN0) to below the VDD−Vth(MP0) voltage range, there will be a significant leakage current on the core power supply.

Embodiments of the present invention provide a novel IO receiver that can solve the above-described drawbacks of the conventional IO receiver. The novel IO receiver according to an embodiment of the present invention includes a transfer gate disposed between the IO circuit and the core circuit of the conventional IO receiver.

FIG. 2 is simplified schematic diagram of a circuit configuration of an IO receiver 200 according to an embodiment of the present invention. As shown in FIG. 2, IO receiver 200 includes a first transfer gate, a first inverter I1, a second inverter I2, a second transfer gate, a third inverter I3, and a fourth inverter I4 connected in series.

Figures 2A, 2B:
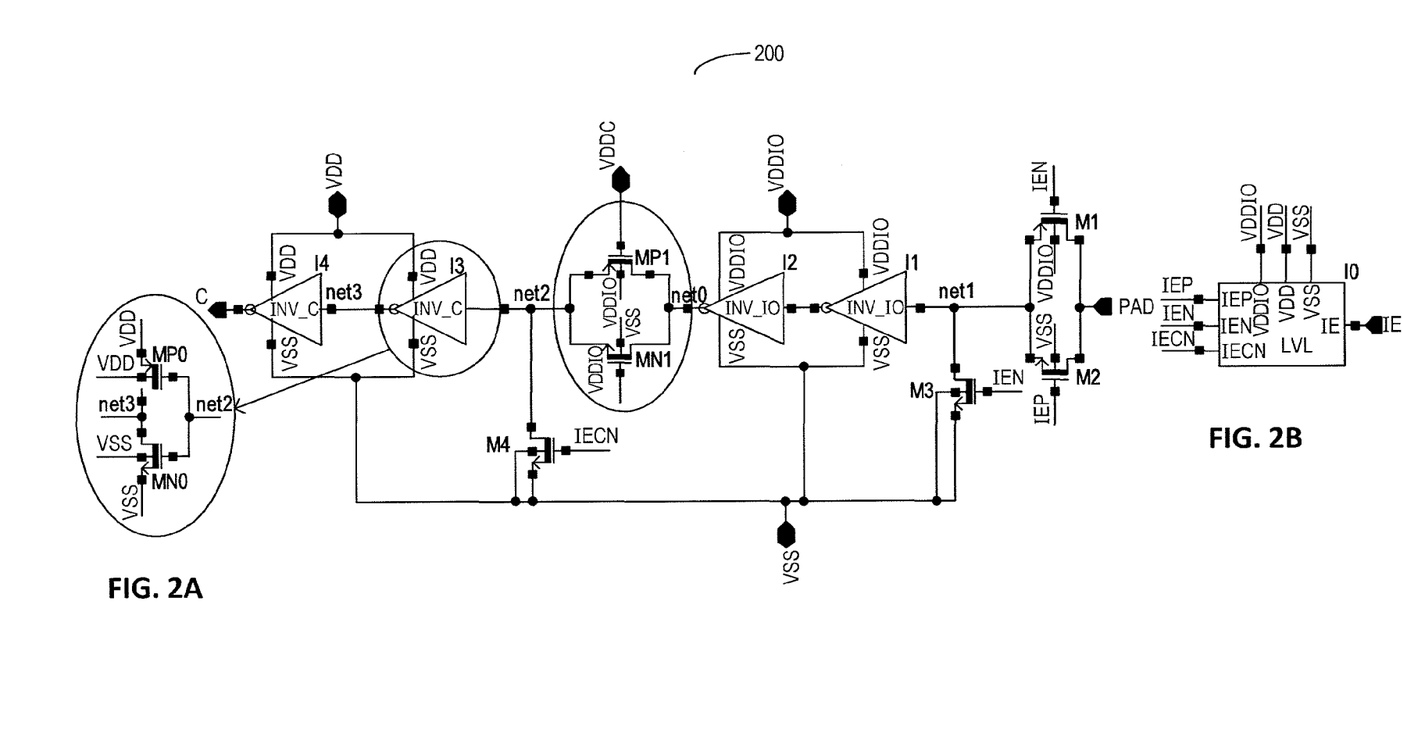
FIG. 2A is a detailed circuit diagram of a portion of the IO receiver of FIG. 2 according to an embodiment of the present invention.
FIG. 2B is a simplified block diagram that generates internal core and IO control signals of the IO receiver of FIG. 2 according to an embodiment of the present invention.

The first inverter I1 and the second inverter I2 are powered by a first power supply, exemplarily shown as IO power supply VDDIO. The first inverter I1 and the second inverter I2 are powered by the IO power supply, thus, the first inverter I1 and the second inverter I2 are referred to as IO inverters, and the circuit portion formed thereof is referred to as an IO circuit portion. The third inverter I3 and the fourth inverter I4 are powered by a second power supply, exemplarily shown as core power supply VDD. The third inverter I3 and the fourth inverter I4 are powered by the core power supply, thus, the third inverter I3 and the fourth inverter I4 are referred to as core inverters, and the circuit portion formed thereof is referred to as a core circuit portion. The third inverter I3 includes an IO PMOS transistor MP0 and an IO NMOS transistor MN0, as shown in FIG. 2A. Those of skill in the art will appreciate that other inverters of the IO receiver may have a similar structure, and the other inverters will not be described in detail for the sake of brevity.

The first transfer gate includes an IO PMOS transistor M1 and an IO NMOS transistor M2 electrically connected in parallel. The transistor M1 has a gate connected to a first signal pin IEN; the transistor M2 has a gate connected to a second signal pin IEP. The second transfer gate includes an IO PMOS transistor MP1 and an IO NMOS transistor MN1 electrically connected in parallel. The transistor MP1 has a gate connected to a third power supply; the transistor MN1 has a gate connected to the first power supply. In an exemplary embodiment, the third power supply is VDDC. The substrate of the transistor MP1 is connected to the first power supply, and the substrate of the transistor MN1 is connected to ground.

IO receiver 200 is enabled or disabled by the core signal pin IE. IECN is an internal core signal and has a logic level opposite the logic level of the signal pin IE. IEP is an internal IO signal and has the same logic level of the signal pin IE. IEN is an internal IO signal and has a logic level opposite the logic level of the signal pin IE. IECN is typically generated from the input signal IE through an odd number of series-connected core inverters. IEN and IEP are typically generated from the input signal IE through a level shifter and/or an IO buffer. FIG. 2B is a circuit configured to generate the signals IEP, IEN, IECN of IO receiver 200 according to an embodiment of the present invention.

IO receiver 200 further includes a third transistor M3 and a fourth transistor M4. M3 is configured to pull down the output of the first transfer gate to logic low when IO receiver 200 is disabled, and M4 is configured to pull down the output of the second transfer gate to logic low when IO receiver 200 is disabled. In an exemplary embodiment, transistors M3 and M4 are NMOS transistors.

The transistor M3 has a gate connected to the first signal pin IEN, a drain connected to the output of the first transfer gate, and a source connected to ground. The transistor M4 has a gate connected to the third signal pin IECN, a drain connected to the output of the second transfer gate, and a source connected to ground. The substrate of the third transistor M3 and the substrate of the fourth transistor M4 are connected to ground. The first signal pin IEN has a logic level opposite that logic level of the second signal pin IEP, and the first signal pin IEN has the same logic level as the logic level of the third signal pin IECN.

During the power down of the IO power supply, when the IO receiver is enabled and the core power supply VDD remains on, IE and IEP are logic high, IEN and IECN are logic low, the transistors M3 and M4 are turned off. The voltage v(net0) at a node net0 follows the voltage v(PAD) at the IO receiver input, and their logic high voltage levels are the same as the decreasing voltage level of VDDIO during power-down.

When the transistor MN1 of the second transfer gate is turned on, i.e., it satisfies Vs≤V−Vth, it necessarily satisfies Vs≤VDDIO−Vth, wherein Vs is the voltage at the source of the transistor MN1, Vg is the voltage at the gate of the transistor MN1, and Vth is the threshold voltage of the transistor MN1.

When the transistor MP1 of the second transfer gate is turned on, i.e., it satisfies Vs≥Vg+Vth, it necessarily satisfies Vs≥VDDC+Vth, wherein Vs is the voltage at the source of the transistor MP1, Vg is the voltage at the gate of the transistor MP1, and Vth is the threshold voltage of the transistor MP1.

Therefore, as VDDIO decreases, the transfer gate formed of transistors MP1 and MN1 can block the input voltage in the range between VDDIO−Vth(MN1) and VDDC+Vth(MP1). Because the core leakage current occurs when v(net0) decrease to the range between Vth(MN0) and VDD−Vth(MP0), the input voltage blocking range of the second transfer gate is adjusted to that range to minimize the leakage current.

When the core supply voltage VDD is sufficiently decreased to satisfy the condition VDD−Vth(MP0)−Vth(MN1)≤Vth(MN0), VDDC=VDD−Vth(MP0)−Vth(MP1), the transfer gate formed of transistors MP1 and MN1 can block the input voltage in the range between Vth(MN0) and VDD−Vth(MP0), and the gate of the transistor M4 is connected to the third signal pin IECN, as shown in FIG. 2. Thus, when the IO receiver is enabled during the decrease in the IO power supply voltage, the core leakage current is significantly reduced.

Since the power supply voltage VDDC is much lower than the power supply voltage VDDIO, when the IO power supply voltage remains constant, the voltage v(net2) at node net2 is in the range between 0V to VDDIO, so that the performance of the IO receiver is constant.

Figure 3:
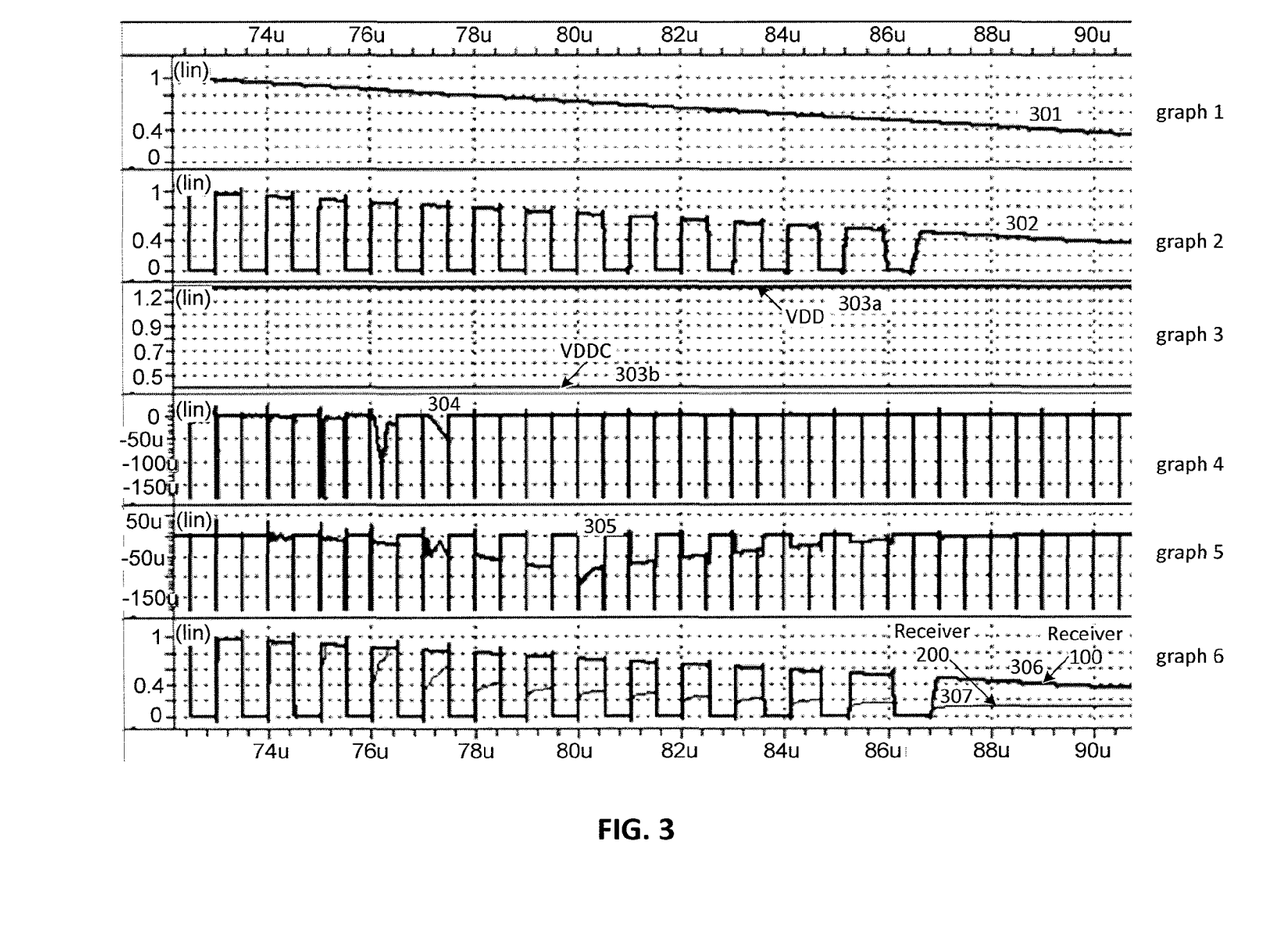
FIG. 3 is a set of graphs illustrating emulated core power leakage currents of the conventional IO receiver of FIG. 1 and the IO receiver of FIG. 2 in the event that the IO power supply is lost while the core power supply remains on and the IO receiver is enabled.

FIG. 3 is a set of graphs illustrating emulated core power leakage currents of the conventional IO receiver 100 of FIG. 1 and the IO receiver 200 of FIG. 2 in the event that the IO power supply is turned off while the core power supply remains on and the IO receiver is enabled. A total of six graphs are shown in FIG. 3: graph 1 is a waveform 301 illustrating the decrease of the IO supply voltage VDDIO going from 3.6 V to 0 V in 100 microseconds; graph 2 is a waveform 302 illustrating the case that the IO receiver is enabled, so that the logic high voltage follows the voltage waveform of the VDDIO of v(PAD); graph 3 includes a voltage waveform 303a of the core VDD at 1.21 V and a voltage waveform 303b of the power supply VDDC at 0.4 V; graph 4 is a current waveform of a core leakage current i(VDD) 304 of the IO receiver of FIG. 2, the average core leakage current is 893 nA; graph 5 is a current waveform 305 illustrating a core leakage current i(VDD) of the IO receiver of FIG. 1, the average core leakage current is 3.04 μA; and graph 6 includes voltage waveforms 306 and 307 at the node net2 of the IO receivers of FIG. 1 and FIG. 2, respectively. The thin line 307 represents the voltage waveform of IO receiver 200 of FIG. 2.

Since the input control signal pin is logic high, the logic high level of v(PAD) follows the power supply voltage VDDIO, and when the decreasing voltage level of VDDIO is higher than VDD−Vth(MP0), there is no core leakage current. Therefore, the sweep time shown in FIG. 3 is from the decrease of VDDIO to a level slightly higher than VDD−Vth(MP0). Prior to 75 μs, the voltages v(net2) of the respective IO receivers of FIG. 1 and FIG. 2 are the same and follow the voltage v(PAD), and the core leakage currents of both IO receivers are low. After 78 μs, when VDDIO is decreased to below VDD−Vth(MP0), the logic high level of the voltage v(net2) of the IO receiver of FIG. 2 is very low, so that the core leakage current is very low. However, the voltage v(net2) of the IO receiver of FIG. 1 follows the voltage v(pad), so that the core leakage current is high until VDDIO is decreased to be lower than Vth(MN0) at 89 μs. The core leakage current between 75 μs and 78 μs in the IO receiver of FIG. 2 is due to the AC delay of the transistor MP1 when |Vgs| is decreased to be close to Vth of the transistor MP1. The IO receiver of FIG. 2 has an average leakage current i(VDD) about ⅓ of that of the IO receiver of FIG. 1.

Figure 4:
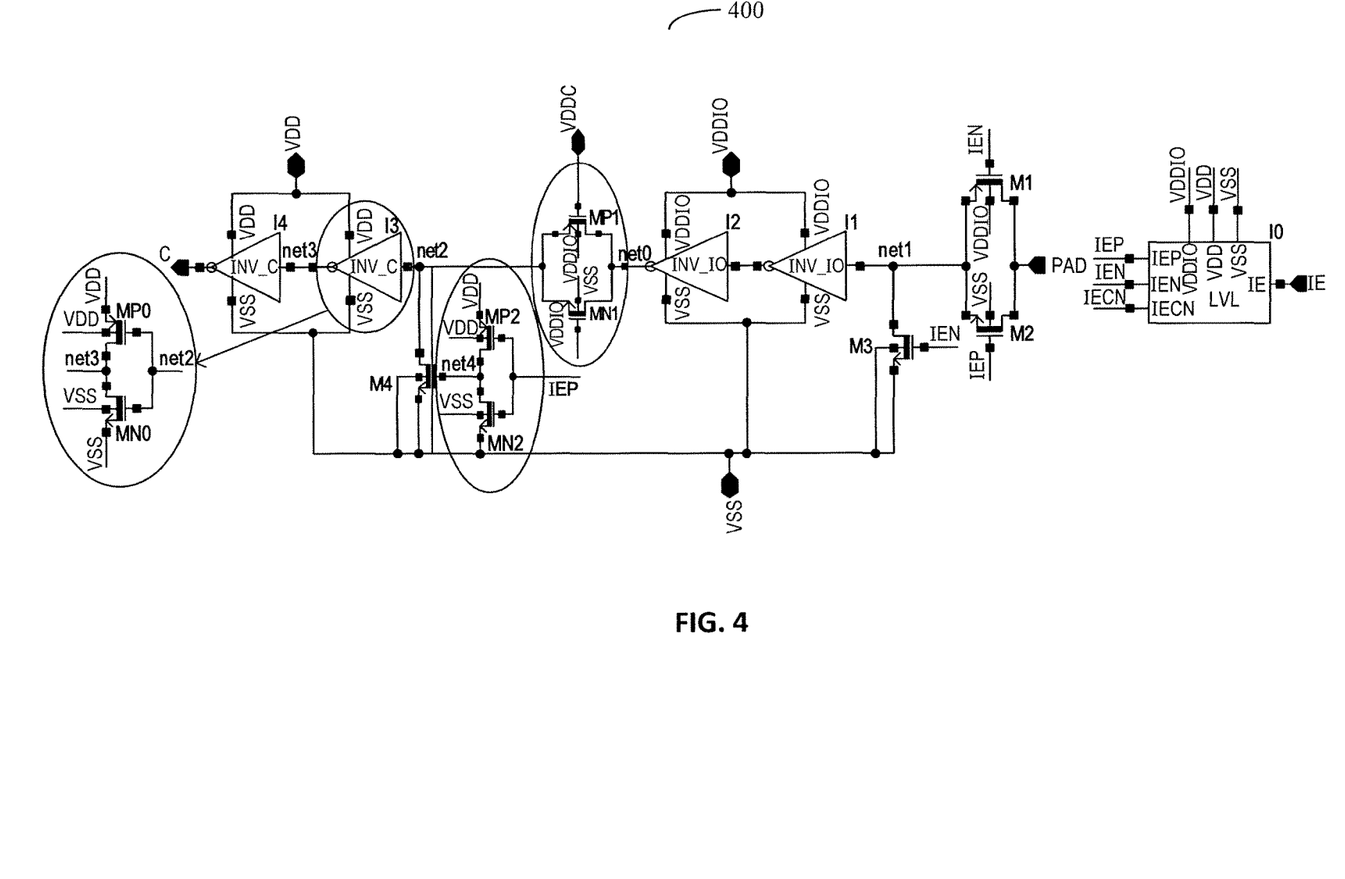
FIG. 4 is simplified schematic circuit diagram of an IO receiver according to another embodiment of the present invention.

FIG. 4 is simplified schematic circuit diagram of an IO receiver 400 according to another embodiment of the present invention. IO receiver 400 is similar to IO receiver 200 with the difference that the gate of the fourth transistor M4 is not connected to the third signal pin IECN, but is connected to the output of a fifth inverter I5. The input of the fifth inverter I5 is connected to the second signal pin IEP. The fifth inverter includes an IO PMOS transistor MP2 and an IO NMOS transistor MN2. The fifth inverter is powered by the core power supply VDD. Specifically, the source and the substrate of the transistor MP2 are connected to the core power supply VDD, the gate of the transistor MP2 is connected to the IO signal pin IEP, which is formed from the core signal pin IE of the enable signal of IO receiver 400, the drain of the transistor MP2 is connected to the gate of the transistor M4. The transistor MN2 has a source and a substrate connected to ground, a gate connected to the IO signal pin IEP, and a drain connected to the gate of the transistor M4. The signal IEP is logic high when the IO receiver is enabled, and logic low when the IO receiver is disabled. Since the other elements of IO receiver 400 are similar to those of IO receiver 200, they are not described herein for the sake of brevity.

In IO receiver 400, the gate of the transistor M4 is connected to the output of the inverter including the transistors MP2 and MN2 instead of being directly connected to the signal pin IECN as in IO receiver 200 described above. In this case, when the voltage v(net0) at node net0 does not decrease at the same rate as the decrease of the IO power supply, the transfer gate formed of the transistors MP1 and MN1 is turned off before the voltage v(net2) falls below Vth(MN0), the voltage v(net2) of node net2 in the floating state is higher than Vth(MN0), resulting in a core leakage current. The core leakage current can be prevented by the inverter formed of the transistors MP1 and MN1 during the power-down of the IO power supply. This is because, when the IO power supply is powered down, the signal IEP goes from logic high to logic low, and v(net4) goes from logic low to logic high, so that the transistor M4 is turned on and pulls the voltage v(net2) to logic low.

The IO receiver 400 of FIG. 4 is suitable for use in the case that, when VDD−Vth(MP0)−Vth(MN1)>Vth(MN0), VDDC≥VDD−Vth(MP0)−Vth(MP1), the transfer gate formed of the transistors MP1 and MN1 is not able to block the input voltage range between Vth(MN0) and VDD−Vth (MP0). The blocking range is between VDDC+Vth(MP1)−Vth(MN1) and VDDC+Vth(MP1). The gate of the transistor M4 is connected to the output of the inverter formed of the transistors MP2 and MN2. During power-down of the IO power supply, since the voltage level of the IO signal IEP follows the decreasing power supply VDDIO and the inverter I5 is powered by the power supply VDD, the voltage level of v(net4) goes from logic low to logic high, the transistor M4 is turned on to pull down v(net2). Since VDDC+Vth(MP1)−Vth(MN1)>Vth(MN0), the Vt of the inverter I5 is set higher than VDDC+Vth(MP1)−Vth(MN1), so that when the output of the transfer gate formed of the transistors MP1 and MN1 is in the range between Vth(MN1) and VDDC+Vth(MP1)−Vth(MN1), the voltage level v(net2) is effectively pulled down to ground. In this case, the leakage current introduced by the inverter I5 formed of the transistors MP2 and MN2 during the inverting phase should be traded off against the reduced leakage current during power-down of the IO power supply, and the value of VDDC also should be traded off against the core leakage current.

Because VDDC is significantly lower than VDDIO, when the IO power supply is on, the signal IEP is logic high, v(net4) is logic low, the transistor M4 is turned off, and v(net2) is in the range between 0 V and VDDIO. The logic level of v(net4) is the same as that of IECN, so that the performance of the IO receiver remains unchanged.

Figure 5:
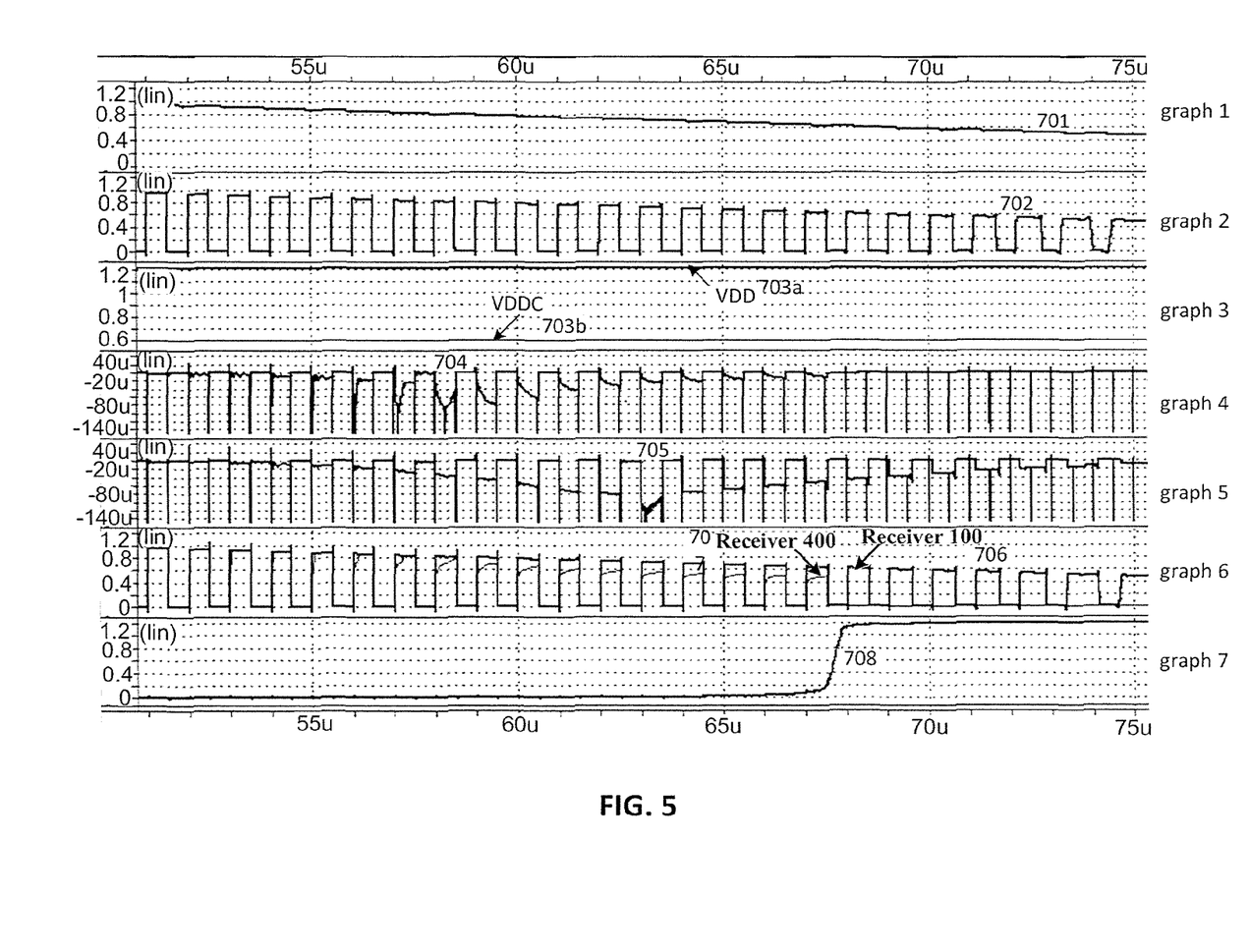
FIG. 5 is a set of graphs illustrating emulated core power leakage currents of the conventional IO receiver of FIG. 1 and the IO receiver of FIG. 4 in the event that the IO power supply is lost while the core power supply remains on and the IO receiver is enabled.

FIG. 5 is a set of graphs illustrating emulated core power leakage currents of the conventional IO receiver 100 of FIG. 1 and the IO receiver 400 of FIG. 4 in the event that the IO power is turned off while the core power supply remains on and the IO receivers are enabled. A total of seven graphs are shown in FIG. 5: graph 1 is a waveform 701 illustrating the decrease of the IO supply voltage VDDIO going from 1.95 V to 0 V in 100 microseconds; graph 2 is a second waveform 702 illustrating the case that the IO receiver is enabled, so that the logic high voltage follows the voltage waveform of the VDDIO of v(PAD); graph 3 includes a voltage waveform 703a of the core VDD at 1.21 V and a voltage waveform 703b of the power supply VDDC at 0.6 V; graph 4 is a current waveform of a core leakage current i(VDD) 704 of the IO receiver of FIG. 4, the average core leakage current is 2.61 μA; graph 5 is a current waveform 705 illustrating a core leakage current i(VDD) of the IO receiver of FIG. 1, the average core leakage current is 5.27 μA; graph 6 includes voltage waveforms 706 and 707 at the node net2 of the IO receivers of FIG. 1 and FIG. 4, respectively. The thin line 707 represents the voltage waveform of the IO receiver 400 of FIG. 4, and graph 7 is a voltage waveform 708 at the node net4 in FIG. 4.

Since in the case that VDD−Vth(MP0)−Vth(MN1)>Vth (MN0), IO receiver 400 of FIG. 4 will be used. Prior to 56 μs, the voltages v(net2) of the respective IO receivers of FIG. 1 and FIG. 4 are the same and follow the voltage v(PAD), and the core leakage currents of both IO receivers are low. After 61 μs, when VDDIO is decreased to below VDD−Vth(MP0), the logic high level of the voltage v(net2) of the IO receiver of FIG. 4 is reduced by Vth(MN1), so that the core leakage current is significantly reduced. However, the voltage v(net2) of the IO receiver of FIG. 1 follows the voltage v(PAD), so that the core leakage current is very high until VDDIO is decreased to be lower than Vth(MN0) at 80 μs. However, because the voltage level of v(net4) goes from logic low to logic high, the voltage v(net2) is pulled down to substantially below Vth(MN0). The core leakage current of the IO receiver of FIG. 4 is relatively low after 68 μs. The core leakage current of the IO receiver of FIG. 4 between 56 μs and 61 μs is due to the AC delay of the transistor MP1 when |Vgs| is decreased to be close to Vth of the transistor MP1. The IO receiver 400 of FIG. 4 has an average leakage current i(VDD) about ½ of that of the IO receiver of FIG. 1. The core leakage current is significantly reduced in the IO receiver of FIG. 4.

In summary, embodiments of the present invention provide an IO receiver that has a reduced leakage current of the core power supply while the IO power supply is turned off and the core power supply remains on and the IO receiver is enabled. In accordance with the present invention, the IO receiver performance remains unchanged while the core leakage current is significantly reduced.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. An input/output (IO) receiver, comprising:
 a first transfer gate having a PMOS transistor and an NMOS transistor electrically connected in parallel;
 a first inverter;
 a second inverter;
 a second transfer gate having a PMOS transistor and an NMOS transistor electrically connected in parallel;

a third inverter;

a fourth inverter;

a first power supply configured to supply power to the first inverter and the second inverter;

a second power supply configured to supply power to the third inverter and the fourth inverter;

a third power supply connected to a gate of the PMOS transistor of the second transfer gate;

a first transistor connected to an output of the first transfer gate;

a second transistor connected to an output of the second transfer gate; and a first signal having a first logic level and a second signal having a second logic level opposite the first logic level, the first and second signal being derived from a core signal configured to enable and disable the IO receiver, wherein the first transfer gate, the first inverter, the second inverter, the second transfer gate, the third inverter, and the fourth inverter are connected in series, wherein a gate of the PMOS transistor of the first transfer gate is connected to the first signal, a gate of the NMOS transistor of the first transfer gate is connected to the second signal, and a gate of the NMOS transistor of the second transfer gate is connected to the first power supply, wherein the first transistor is configured to pull the output of the first transfer gate to a logic low level when the IO receiver is disabled, and wherein the second transistor is configured to pull the output of the second transfer gate to a logic low level when the IO receiver is disabled.

2. The IO receiver of claim 1, wherein the first transistor and the second transistor are NMOS transistors.

3. The IO receiver of claim 2, wherein the first transistor comprises a gate connected to the first signal, a drain connected to the output of the first transfer gate, and a source connected to ground; and the second transistor comprises a drain connected to the output of the second transfer gate, and a source connected to ground.

4. The IO receiver of claim 3, wherein a gate of the second transistor is connected to a third signal having a third logic level the same as the first logic level of the first signal.

5. The IO receiver of claim 4, further comprising a fifth inverter powered by the second power supply and comprising an input connected to the second signal and an output connected to the gate of the second transistor.

6. The IO receiver of claim 4, wherein the third signal is generated through an odd number of series-connected inverters in a core portion of the IO receiver from a core signal configured to enable and disable the IO receiver.

7. The IO receiver of claim 1, wherein a substrate of the PMOS transistor of the second transfer gate is connected to the first power supply, and the substrate of the NMOS transistor of the second transfer gate is connected to ground.

8. The IO receiver of claim 1, wherein a substrate of the first transistor and a substrate of the second transistor are connected to ground.

9. The IO receiver of claim 1, wherein the first power supply is an IO power supply, and the second power supply is a core power supply.

10. The IO receiver of claim 1, wherein the third power supply has a voltage level lower than a voltage level of the first power supply.

11. The IO receiver of claim 1, further comprising a level shifter configured to receive the core signal and generate the first and second signals.

* * * * *